(12) United States Patent
Song et al.

(10) Patent No.: US 12,431,848 B2
(45) Date of Patent: Sep. 30, 2025

(54) PUSH-PULL POWER AMPLIFIER

(71) Applicant: MediaTek Singapore Pte. Ltd., Singapore (SG)

(72) Inventors: Decheng Song, Singapore (SG); Ee-Sze Khoo, Singapore (SG); Chee-Lee Heng, Singapore (SG)

(73) Assignee: MediaTek Singapore Pte. Ltd., Singapore (SG)

( * ) Notice: Subject to any disclaimer, the term of this patent is extended or adjusted under 35 U.S.C. 154(b) by 384 days.

(21) Appl. No.: 17/984,267

(22) Filed: Nov. 10, 2022

(65) Prior Publication Data

US 2023/0396221 A1   Dec. 7, 2023

Related U.S. Application Data

(60) Provisional application No. 63/349,168, filed on Jun. 6, 2022.

(51) Int. Cl.
*H03F 3/26* (2006.01)

(52) U.S. Cl.
CPC ....... *H03F 3/265* (2013.01); *H03F 2200/459* (2013.01)

(58) Field of Classification Search
CPC .............. H03F 3/265; H03F 2200/459; H03F 3/45251; H03F 1/308; H03F 2200/21;
(Continued)

(56) References Cited

U.S. PATENT DOCUMENTS

2011/0074509 A1    3/2011  Samavedam
2013/0222064 A1*   8/2013  Kimball ................ H03F 1/0261
                                                          330/253
(Continued)

FOREIGN PATENT DOCUMENTS

CN      109361366 A     2/2019
CN      114531117 A     5/2022
(Continued)

OTHER PUBLICATIONS

Debopriyo Chowdhury et al., A Single-Chip Highly Linear 2.4GHz 30dBm Power Amplifier in 90nm CMOS, ISSCC 2009 IEEE International Solid-State Circuits Conference-Digest of Technical Papers, Session 22 / PA and Antenna Interface / 22.3, Feb. 11, 2009, IEEE, p. 378-380, XP031466144 ,Feb. 11, 2009.

*Primary Examiner* — Andrea Lindgren Baltzell
*Assistant Examiner* — Khiem D Nguyen
(74) *Attorney, Agent, or Firm* — Winston Hsu

(57) ABSTRACT

A push-pull power amplifier (PA) includes a pair of P-type transistors, a pair of N-type transistors, and a splitter, wherein source terminals of the pair of P-type transistors are coupled to a first reference voltage, source terminals of the pair of N-type transistors are coupled to a second reference voltage, and drain terminals of the pair of P-type transistors and drain terminals of the pair of N-type transistors are coupled to an output port of the push-pull PA. The splitter is arranged to receive a common-mode input pair, and provide two differential output pairs to the pair of P-type transistors and the pair of N-type transistors, wherein one of the two differential output pairs is provided to gate terminals of the pair of P-type transistors, and the other of the two differential output pairs is provided to gate terminals of the pair of N-type transistors.

15 Claims, 3 Drawing Sheets

(58) Field of Classification Search
CPC ............ H03F 2203/45151; H03F 2203/45154;
H03F 2203/45156; H03F 2203/45244;
H03F 2203/45542; H03F 2203/45544;
H03F 3/21; H03F 3/3098; H03F 2200/06;
H03F 2200/09
USPC .................................................. 330/69, 301
See application file for complete search history.

(56) References Cited

U.S. PATENT DOCUMENTS

2019/0165739 A1   5/2019   Lyalin
2021/0099132 A1   4/2021   Hsu

FOREIGN PATENT DOCUMENTS

KR   10-2017-0096111 A   8/2017
TW            420901      2/2001

* cited by examiner

PUSH-PULL POWER AMPLIFIER

CROSS REFERENCE TO RELATED APPLICATIONS

This application claims the benefit of U.S. Provisional Application No. 63/349,168, filed on Jun. 6, 2022. The content of the application is incorporated herein by reference.

BACKGROUND

For advanced process technology, a maximum supply voltage (e.g. 3.6V) provided by a battery needs to be scaled down to 1.8V due to reliability concern. In order to minimize the power loss, a DC to DC buck converter instead of a low dropout (LDO) regulator will be utilized to scale down the supply voltage from 3.6V to 1.8V. For an open-drain power amplifier (PA), a high local oscillator (LO) current is required for pulling concern, which will increase the total power consumption, and additional band pass filters (BPFs) or notch filters are also required to remove half-LO spurs or process the second harmonic distortion (HD2), which will increase the off-chip component cost. In addition, an output balun with its center tap to supply of the open-drain PA will have a large IR drop due to a large DC current flowing into the balun, which will impact the PA efficiency. For a conventional push-pull PA (e.g. a transformer-based push-pull PA), although the above-mentioned disadvantages of the open-drain PA may be overcome, some additional problems may occur, however. For example, the transformer-based push-pull PA may have a large DC-DC buck ripple problem. As a result, a novel push-pull PA is urgently needed to solve the problems without introducing any side effect or in a way that is less likely to introduce a side effect.

SUMMARY

It is therefore one of the objectives of the present invention to provide a splitter-based push-pull PA and a power amplifying method thereof, to address the above-mentioned issues.

According to an embodiment of the present invention, a push-pull PA is provided. The push-pull PA may include a pair of P-type transistors, a pair of N-type transistors, and a splitter, wherein source terminals of the pair of P-type transistors are coupled to a first reference voltage, source terminals of the pair of N-type transistors are coupled to a second reference voltage, the first reference voltage is higher than the second reference voltage, and drain terminals of the pair of P-type transistors and drain terminals of the pair of N-type transistors are coupled to an output port of the push-pull PA. The splitter may be arranged to receive a common-mode input pair, and provide two differential output pairs to the pair of P-type transistors and the pair of N-type transistors, wherein one of the two differential output pairs is provided to gate terminals of the pair of P-type transistors, and the other of the two differential output pairs is provided to gate terminals of the pair of N-type transistors.

According to an embodiment of the present invention, a power amplifying method is provided, wherein power amplifying the method is applied with a push-pull PA comprising a pair of P-type transistors, a pair of N-type transistors, and a splitter; source terminals of the pair of P-type transistors are coupled to a supply voltage; source terminals of the pair of N-type transistors are coupled to a ground voltage, and drain terminals of the pair of P-type transistors and drain terminals of the pair of N-type transistors are coupled to an output port of the push-pull PA; and the method comprises: receiving, by the splitter, a common-mode input pair; and providing, by the splitter, two differential output pairs to the pair of P-type transistors and the pair of N-type transistors, wherein one of the two differential output pairs is provided to gate terminals of the pair of P-type transistors, and the other of the two differential output pairs is provided to gate terminals of the pair of N-type transistors.

One of the benefits of the present invention is that, compared with the open-drain PA, the splitter-based push-pull PA of the present invention requires a lower LO current, which can improve the power consumption, and no additional BPFs or notch filters are required to remove half-LO spurs or process the HD2, which can save the off-chip component cost, for the splitter-based push-pull PA. In addition, since there is no DC current flowing into an output balun of the push-pull PA, the splitter-based push-pull PA will not have an IR drop, which can improve the PA efficiency. Compared with the transform-based push-pull PA, the splitter-based push-pull PA of the present invention can improve the DC-DC buck ripple problem.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ".

Figure 1:
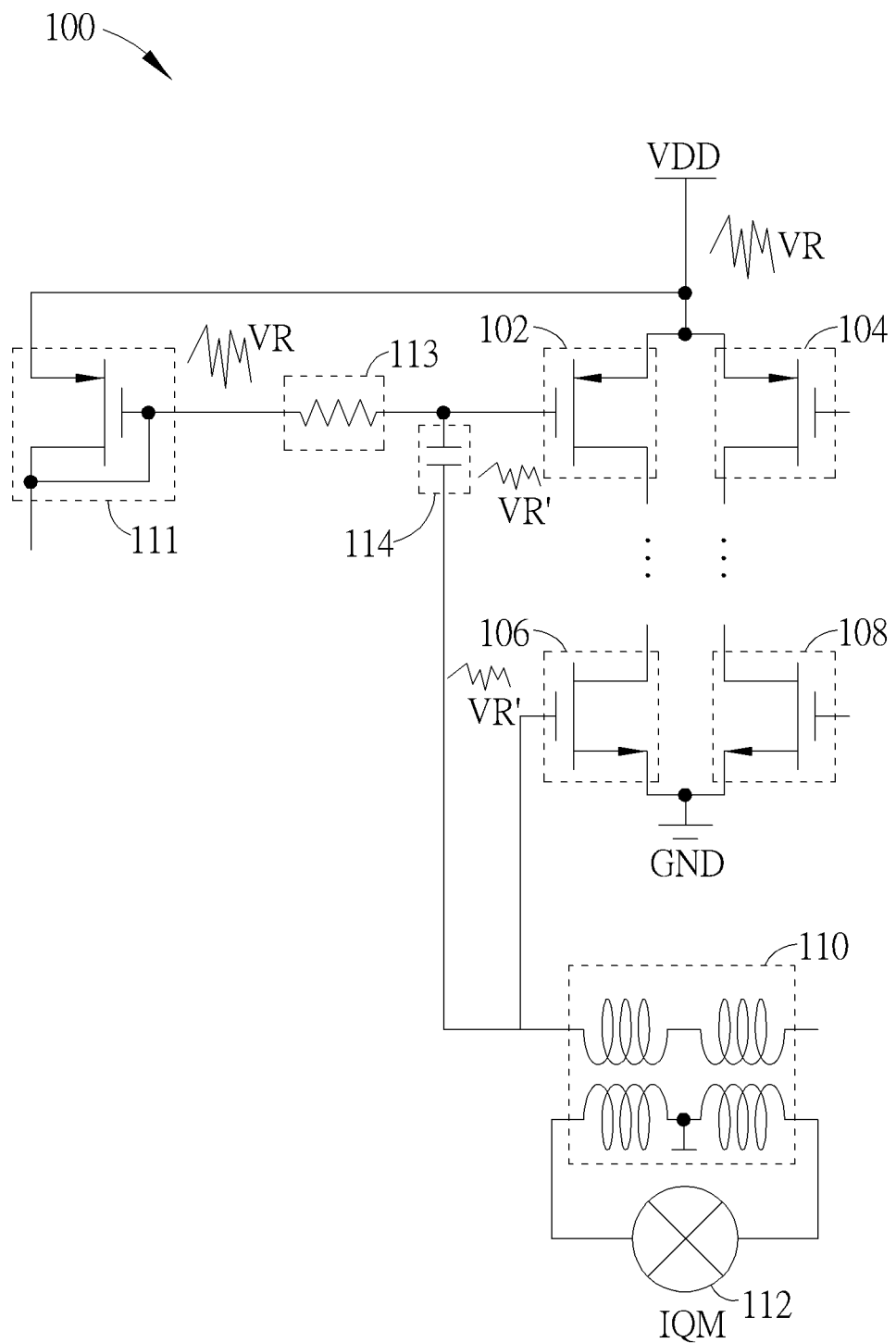
FIG. 1 is a diagram illustrating a transformer-based push-pull power amplifier.

FIG. 1 is a diagram illustrating a transformer-based push-pull power amplifier (PA) 100. As shown in FIG. 1, the transformer-based push-pull PA 100 may include a pair of P-type transistors 102 and 104, a pair of N-type transistors 106 and 108, a transformer 110, an in-phase quadrature modulator (IQM) 112 and a diode (e.g. a diode-connected transistor), wherein source terminals of the P-type transistors 102 and 104 are coupled to a first reference voltage (e.g. a supply voltage VDD), and source terminals of the N-type transistors 106 and 108 are coupled to a second reference voltage (e.g. a ground voltage GND). The diode may include a P-type transistor 111, wherein the P-type transistor 111 has a gate terminal coupled to a drain terminal of the P-type transistor 111 and a source terminal coupled to the supply voltage VDD. The transformer-based push-pull power amplifier (PA) 100 may utilize the transformer 110 to transmit a signal output from the IQM 112 to the P-type transistors 102 and 104 (for brevity, only the transmission path between the transformer 110 and the P-type transistor 102 is shown in FIG. 1).

It should be noted that, for the transformer-based push-pull PA 100, there will be a biasing resistor 113 between the transformer 110 and the P-type transistor 111. The source terminals of the P-type transistors 102, 104, and 111 may be perturbed by a voltage ripple VR from the supply voltage VDD, wherein the voltage ripple VR may also be transmitted to the gate terminals of the P-type transistors 102 and 104 from the P-type transistor 111 through the biasing resistor 113. However, due to the existence of the biasing resistor 113 between the transformer 110 and the P-type transistor 111, a voltage ripple VR' at the gate terminals of the P-type transistors 102 and 104 may not fully follow the voltage ripple VR (e.g. the voltage ripple VR' is smaller than the voltage ripple VR (VR'<VR)).

That is, the voltage ripple VR' at the gate terminals of the P-type transistors 102 and 104 may not fully follow the voltage ripple VR at the sources terminals of the P-type transistors 102 and 104. As a result, the voltage difference between the gate terminals and the source terminals of the P-type transistors 102 and 104 may not be equal to 0 (i.e. VGS≠0), and the voltage ripple between the gate terminals and the source terminals of the P-type transistors 102 and 104 may be amplified by the P-type transistors 102 and 104, which may result in a large spur at the output of the transformer-based push-pull PA 100. In addition, for the transformer-based push-pull PA 100, there will be an AC current by coupling capacitor 114 between gate terminals of the P-type transistors 102 and 104 and gate terminals of the N-type transistors 106 and 108, and the transformer-based push-pull PA 100 may utilize the AC current by coupling capacitor 114 to make the P-type transistors 102 and 104 and the N-type transistors 106 and 108 simultaneously receive the signal output from the IQM 112 (for brevity, only the transmission path between the P-type transistor 102 and the N-type transistor 106 is shown in FIG. 1). It should be noted that, the voltage ripple VR' at the gate terminals of the P-type transistors 102 and 104 may also be transmitted to the gate terminals of the N-type transistors 106 and 108 through the AC current by coupling capacitor 114, which will result in voltage disturbance between the gate terminals of the N-type transistors 106 and 108 and the ground voltage GND, and a large spur at the output of the transformer-based push-pull PA 100.

Consider a case where a maximum supply voltage (e.g. 3.6V) provided by a battery is converted down to 1.8V by an open-drain PA. For the open-drain PA, a high local oscillator (LO) current is required for pulling concern, and additional band pass filters (BPFs) or notch filters are required to remove half-LO spurs or process the second harmonic distortion (HD2). In addition, an output balun of the open-drain PA will have a large IR drop due to a large direct current (DC) current flowing into the balun, which will impact the PA efficiency. For the transformer-based push-pull PA 100, the above-mentioned disadvantages of the open-drain PA may be overcome. However, the transformer-based push-pull PA 100 may suffer from the above-mentioned DC-DC buck ripple problem.

Figure 2:
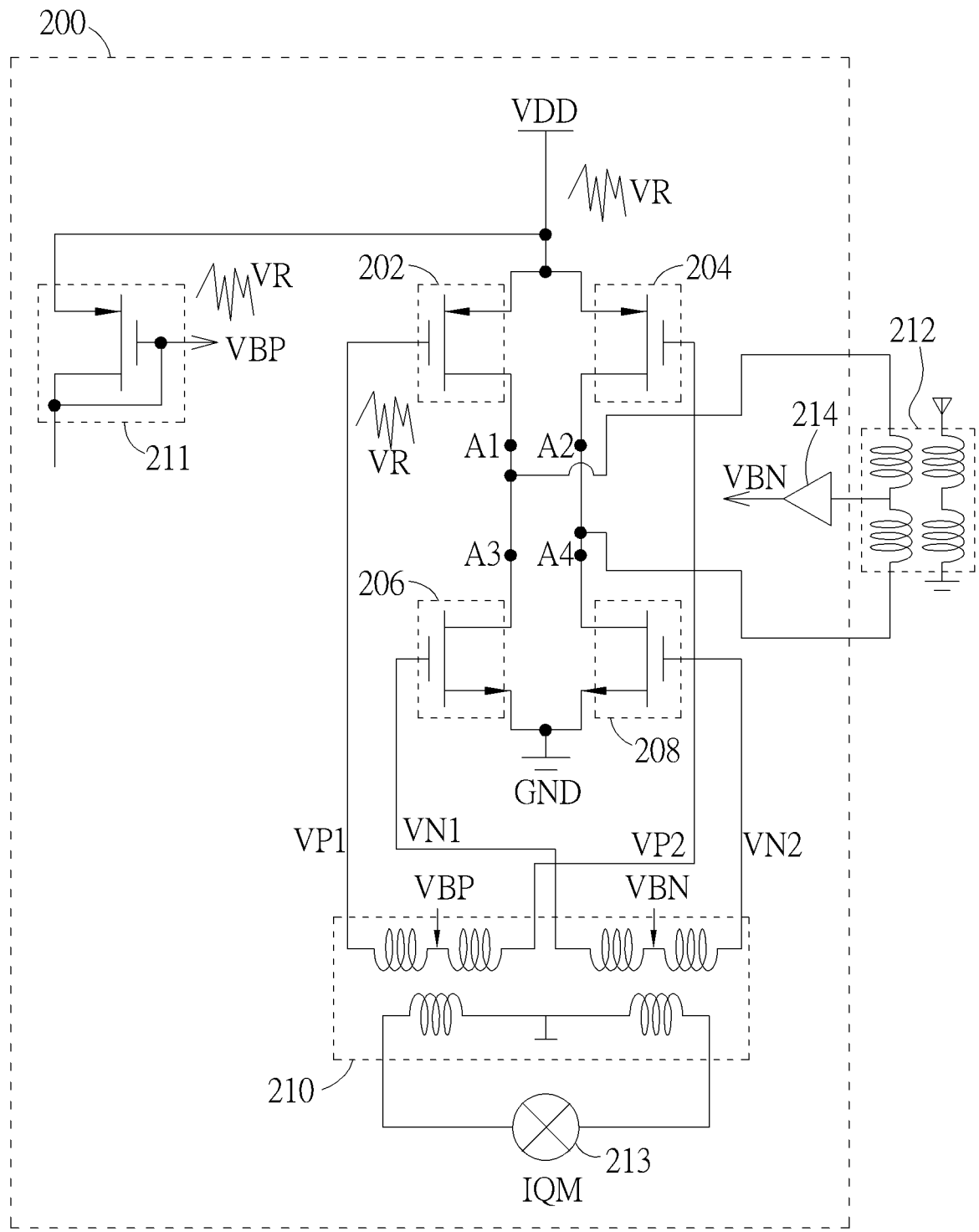
FIG. 2 is a diagram illustrating a splitter-based push-pull power amplifier according to an embodiment of the present invention.

In order to overcome the disadvantages of the open-drain PA and avoid the DC-DC buck ripple problem of the transformer-based push-pull PA 100 at the same time, the present invention provides a splitter-based push-pull PA. Please refer to FIG. 2. FIG. 2 is a diagram illustrating a splitter-based push-pull PA 200 according to an embodiment of the present invention. As shown in FIG. 2, the splitter-based push-pull PA 200 may include a pair of P-type transistors 202 and 204, a pair of N-type transistors 206 and 208, a splitter 210, an IQM 213, a diode (e.g. a diode-connected transistor), and a common mode feedback (CMFB) circuit 214, wherein source terminals of the P-type transistors 202 and 204 are coupled to a supply voltage VDD, source terminals of the N-type transistors 206 and 208 are coupled to a ground voltage GND, and drain terminals of the P-type transistors 202 and 204 and drain terminals of the N-type transistors 206 and 208 are coupled to an output port of the splitter-based push-pull PA 200, wherein the output port may include a plurality of output nodes A1, A2, A3, and A4. For example, a load (e.g. a balun 212) may be coupled to the output port (i.e. the output nodes A1, A2, A3, and A4) of the splitter-based push-pull PA 200, and the drain terminals of the P-type transistors 202 and 204 and the drain terminals of the N-type transistors 206 and 208 may be coupled to the balun 212.

The splitter 210 may be arranged to receive a common-mode input pair, and provide two differential output pairs (e.g. a first differential output pair and a second differential output pair) to the P-type transistors 202 and 204 and the N-type transistors 206 and 208, respectively, wherein the first differential output pair includes two differential output voltages VP1 and VP2, and is provided to gate terminals of the P-type transistors 202 and 204, and the second differential output pair includes two differential output voltages VN1 and VN2, and is provided to gate terminals of the N-type transistors 206 and 208. The common-mode input pair may include a first common-mode input voltage VBP and a second common-mode input voltage VBN, wherein the first common-mode input voltage VBP may be provided to the splitter 210 for biasing the first differential output pair (i.e. the differential output voltages VP1 and VP2) to the gate terminals of the P-type transistors 202 and 204, and the second common-mode input voltage VBN may be provided to the splitter 210 for biasing the second differential output pair (i.e. the differential output voltages VN1 and VN2) to the gate terminals of the N-type transistors 206 and 208.

In this embodiment, the diode may include a P-type transistor 211, and may be arranged to bias the first common-mode input voltage VBP. The P-type transistor 211 has a gate terminal coupled to a drain terminal of the P-type transistor 211, and a source terminal coupled to the supply voltage VDD, and the first common-mode input voltage VBP is output from the gate terminal of the P-type transistor 211. In addition, the CMFB circuit 214 may be coupled between the balun 212 and the splitter 210, and may be arranged to bias the second common-mode input voltage VBN.

It should be noted that, a voltage ripple VR of the supply voltage VDD will be fully followed by a voltage ripple of the first common-mode input voltage VBP (i.e. the voltage ripple of the first common-mode input voltage VBP will be equal to the voltage ripple VR of the supply voltage VDD). Since there is no biasing resistor between the splitter 210 and the P-type transistor 211, a voltage ripple at each of the gate terminals of the P-type transistors 202 and 204 is also equal to the voltage ripple VR of the supply voltage VDD. That is, the voltage ripple at each of the gate terminals of the P-type transistors 204 and 206 is equal to a voltage ripple at each of the source terminals of the P-type transistors 202 and 204. In this way, the voltage difference between the gate terminals and the source terminals of the P-type transistors 202 and 204 can be equal to 0 (i.e. VGS=0), which can improve the large spur problem of the transformer-based push-pull PA 100 shown in FIG. 1.

In addition, for the splitter-based push-pull PA 200, there is no AC current by coupling capacitor between the gate terminals of the P-type transistors 202 and 204 and the gate terminals of the N-type transistors 206 and 208, and the second differential output pair (i.e. the differential voltages VN1 and VN2) are provided to the N-type transistors 206 and 208 through the splitter 210. As a result, the voltage ripple at each of the gate terminals of the P-type transistors 202 and 204 will not be transmitted to each of the gate terminals of the N-type transistors 206 and 208, and a voltage ripple at each of the gate terminals of the N-type transistors 206 and 208 is equal to 0, which can improve the DC-DC buck ripple problem of the transformer-based push-pull PA 100 shown in FIG. 1.

Figure 3:
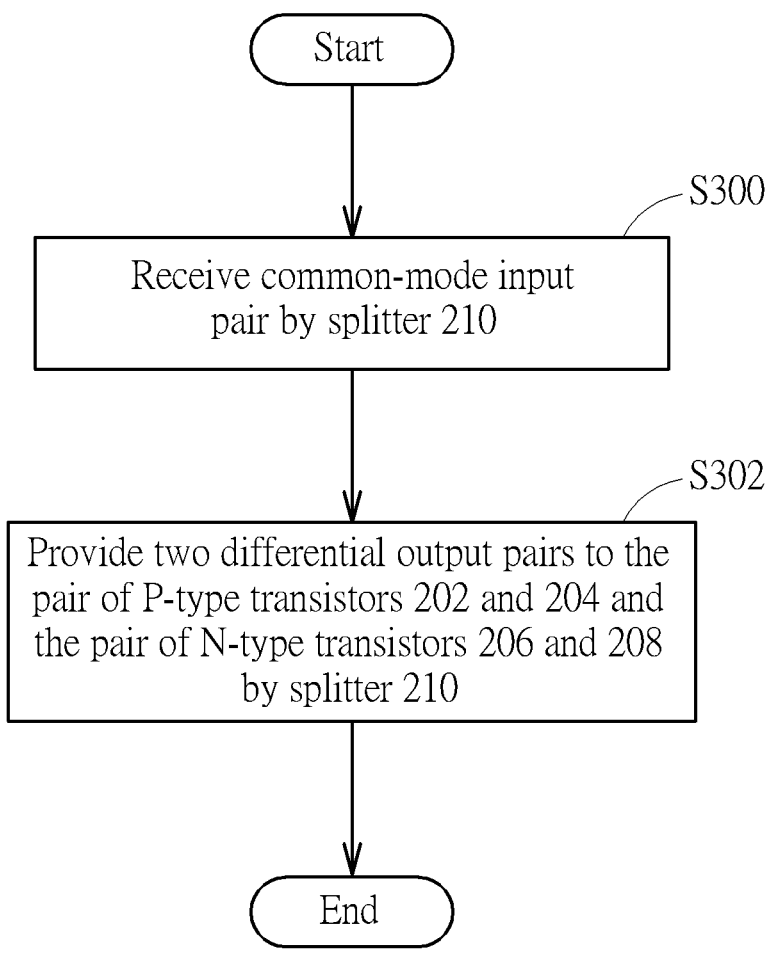
FIG. 3 is a flow chart illustrating a power amplifying method applied with a splitter-based push-pull PA according to an embodiment of the present invention.

FIG. 3 is a flow chart illustrating a power amplifying method applied with a splitter-based push-pull PA according to an embodiment of the present invention. Provided that the result is substantially the same, the steps are not required to be executed in the exact order shown in FIG. 3. For example, the power amplifying method shown in FIG. 3 may be employed by the splitter-based push-pull PA 200 shown in FIG. 2.

In Step 300, a common-mode input pair is received by the splitter 210. For example, the common-mode input pair comprises a first common-mode input voltage VBP and a second common-mode input voltage VBN, wherein the first common-mode input voltage VBP is provided to the splitter 210 for biasing one of two differential output pairs to the gate terminals of the pair of P-type transistors 202 and 204; the first common-mode input voltage VBP is biased by the diode, and is output from the gate terminal of the P-type transistor 211; the second common-mode input voltage VBN is provided to the splitter for biasing the other of the two differential output pairs to the gate terminals of the pair of N-type transistors 206 and 208; and the second common-mode input voltage VBN is biased by the CMFB circuit 214.

In Step 302, the two differential output pairs are provided to the pair of P-type transistors 202 and 204 and the pair of N-type transistors 206 and 208 by the splitter 210, wherein one of the two differential output pairs is provided to gate terminals of the pair of P-type transistors 202 and 204, and the other of the two differential output pairs is provided to gate terminals of the pair of N-type transistors 206 and 208.

Since a person skilled in the pertinent art can readily understand details of the steps after reading above paragraphs directed to the splitter-based push-pull PA 200 shown in FIG. 2, further description is omitted here for brevity.

In summary, compared with the open-drain PA, the splitter-based push-pull PA 200 of the present invention requires a lower LO current, which can improve the power consumption, and no additional BPFs or notch filters are required to remove half-LO spurs or process the HD2, which can save the off-chip component cost, for the splitter-based push-pull PA 200. In addition, since there is no DC current flowing into the balun 212, the splitter-based push-pull PA 200 will not have an IR drop, which can improve the PA efficiency. Compared with the transform-based push-pull PA 100, the splitter-based push-pull PA 200 of the present invention can improve the DC-DC buck ripple problem.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A push-pull power amplifier (PA), comprising:
a pair of P-type transistors, wherein source terminals of the pair of P-type transistors are coupled to a first reference voltage;
a pair of N-type transistors, wherein source terminals of the pair of N-type transistors are coupled to a second reference voltage, the first reference voltage is higher than the second reference voltage, and drain terminals of the pair of P-type transistors and drain terminals of the pair of N-type transistors are coupled to an output port of the push-pull PA;
a splitter, arranged to receive a common-mode input pair comprising a first common-mode input voltage and a second common-mode input voltage, and provide two differential output pairs to the pair of P-type transistors and the pair of N-type transistors, wherein the first common-mode input voltage is provided to the splitter for biasing one of the two differential output pairs to gate terminals of the pair of P-type transistors, and the second common-mode input voltage is provided to the splitter for biasing the other of the two differential output pairs to gate terminals of the pair of N-type transistors; and
a diode, coupled between the first reference voltage and the splitter, and arranged to bias the first common-mode input voltage.

2. The push-pull PA of claim 1, wherein a voltage ripple of the first common-mode input voltage is equal to a voltage ripple of the first reference voltage.

3. The push-pull PA of claim 1, wherein the output port of the push-pull PA is coupled to a load, and the push-pull PA further comprises:
a common mode feedback (CMFB) circuit, coupled between the load and the splitter, and arranged to bias the second common-mode input voltage.

4. The push-pull PA of claim 1, wherein the diode comprises:
a P-type transistor, having a gate terminal coupled to a drain terminal of the P-type transistor and a source terminal coupled to the first reference voltage.

5. The push-pull PA of claim 4, wherein the first common-mode input voltage is output from the gate terminal of the P-type transistor.

6. The push-pull PA claim 1, wherein a voltage ripple at each of the gate terminals of the pair of P-type transistors is equal to a voltage ripple of the first reference voltage.

7. The push-pull PA claim 1, wherein a voltage ripple at each of the gate terminals of the pair of P-type transistors is not transmitted to each of the gate terminals of the pair of N-type transistors.

8. The push-pull PA claim 1, wherein a voltage ripple at each of the gate terminals of the pair of N-type transistors is equal to 0.

9. A power amplifying method, applied with a push-pull power amplifier (PA), wherein the push-pull PA comprises a pair of P-type transistors, a pair of N-type transistors, a diode, and a splitter; source terminals of the pair of P-type transistors are coupled to a supply voltage; source terminals of the pair of N-type transistors are coupled to a ground voltage, and drain terminals of the pair of P-type transistors and drain terminals of the pair of N-type transistors are coupled to an output port of the push-pull PA; the diode is coupled between the supply voltage and the splitter; and the power amplifying method comprises:

receiving, by the splitter, a common-mode input pair, wherein the common-mode input pair comprises a first common-mode input voltage and a second common-mode input voltage, and the first common-mode input voltage is biased by the diode; and providing, by the splitter, two differential output pairs to the pair of P-type transistors and the pair of N-type transistors, wherein the first common-mode input voltage is provided to the splitter for biasing one of the two differential output pairs to gate terminals of the pair of P-type transistors, and the second common-mode input voltage is provided to the splitter for biasing the other of the two differential output pairs to gate terminals of the pair of N-type transistors.

10. The power amplifying method of claim 9, wherein a voltage ripple of the first common-mode input voltage is equal to a voltage ripple of the supply voltage.

11. The power amplifying method of claim 9, wherein the output port of the push-pull PA is coupled to a load, the push-pull PA further comprises a common mode feedback (CMFB) circuit coupled between the load and the splitter, and the method further comprises:

biasing the second common-mode input voltage, by the CMFB circuit.

12. The power amplifying method of claim 9, wherein the diode comprises a P-type transistor, the P-type transistor has a gate terminal coupled to a drain terminal of the P-type transistor and a source terminal coupled to the supply voltage, and the method further comprises:

outputting the first common-mode input voltage from the gate terminal of the P-type transistor.

13. The power amplifying method of claim 9, wherein a voltage ripple at each of the gate terminals of the pair of P-type transistors is equal to a voltage ripple of the supply voltage.

14. The power amplifying method of claim 9, wherein a voltage ripple at each of the gate terminals of the pair of P-type transistors is not transmitted to each of the gate terminals of the pair of N-type transistors.

15. The power amplifying method of claim 9, wherein a voltage ripple at each of the gate terminals of the pair of N-type transistors is equal to 0.

\* \* \* \* \*